United States Patent [19]

Shibata

[11] Patent Number: 5,411,920

[45] Date of Patent: May 2, 1995

[54] LEAD FRAME, SEMICONDUCTOR DEVICE, AND METHOD OF MANUFACTURING SAME

[75] Inventor: Kazutaka Shibata, Kyoto, Japan

[73] Assignee: Rohm Co., Ltd., Kyoto, Japan

[21] Appl. No.: 226,504

[22] Filed: Apr. 12, 1994

Related U.S. Application Data

[62] Division of Ser. No. 30,854, Mar. 12, 1993, Pat. No. 5,309,018.

[30] Foreign Application Priority Data

Apr. 28, 1992 [JP] Japan .................. 4-110046

[51] Int. Cl.⁶ .......................................... H01L 21/60
[52] U.S. Cl. ............................. 437/217; 437/209; 437/215; 437/219; 437/220
[58] Field of Search ............ 437/209, 217, 215, 211, 437/219, 220; 257/666, 667, 669, 670, 674, 676

[56] References Cited

U.S. PATENT DOCUMENTS

| | | | |
|---|---|---|---|
| 4,084,312 | 4/1978 | Kirk et al. | 437/217 |
| 4,663,650 | 5/1987 | Gilder, Jr. et al. | 257/676 |
| 4,870,474 | 9/1989 | Karashima | 257/670 |
| 4,977,442 | 12/1990 | Suzuki et al. | 257/670 |
| 5,206,188 | 4/1993 | Hiroi et al. | 437/211 |
| 5,233,738 | 6/1993 | Okada | 257/674 |
| 5,250,470 | 10/1993 | Yamaguchi | 437/211 |
| 5,289,032 | 2/1994 | Higgins, III et al. | 257/674 |

FOREIGN PATENT DOCUMENTS

63-217637 9/1989 Japan .

*Primary Examiner*—Brian E. Hearn
*Assistant Examiner*—Kevin M. Picardat
*Attorney, Agent, or Firm*—Brumbaugh, Graves, Donohue & Raymond

[57] ABSTRACT

A lead frame has a die pad with an array of surrounding leads connected at their sides by tie bars and at their ends by coupling bars which are connected through narrow supports to surrounding side rails or partition frames. Positioning holes are provided as positioning references in the coupling bars when the coupling parts of the leads such as the tie bars are removed to separate the leads from the lead frame.

1 Claim, 2 Drawing Sheets

LEAD FRAME, SEMICONDUCTOR DEVICE, AND METHOD OF MANUFACTURING SAME

This application is a division of application Ser. No. 08/030,854, filed on Mar. 12, 1993, now U.S. Pat. No. 5,309,018.

BACKGROUND OF THE INVENTION

This invention relates to lead frames and semiconductor devices formed with a lead frame, and to a method for manufacturing a semiconductor device with a lead frame.

Many semiconductor devices having a number of lead terminals spaced at extremely small intervals must be mounted on a lead frame having leads which are spaced at correspondingly small intervals and tie bars which join the leads prior to assembly and must be cut with a high degree of accuracy. The step by which the semiconductor device is sealed in resin, which occurs prior to cutting of the tie bars, tends to displace the leads, making it difficult to cut the tie bars accurately.

One conventional process for manufacturing a semiconductor device is shown in FIGS. 3 and 4. In that process, a semiconductor chip (not visible in the drawings) including a semiconductor circuit is placed on the die pad of a lead frame 1, and the electrodes of the semiconductor chip are electrically connected to closely-spaced leads 2 arranged around the die pad with metal wires such as gold wires. Thereafter, the semiconductor chip on the die pad, the metal wires, and parts of the leads 2 are sealingly covered with resin 11, and then the closely-spaced leads 2 are separated from the lead frame 1 and from each other by a cutting operation.

As shown in FIG. 3, the leads 2 are spaced at predetermined close intervals in the lead frame and they are joined to one another by a series of tie bars 3 and coupling bars 4, and are positioned in the lead frame by narrow supports 5 connected to the side rails 6 of the lead frame. The tie bars 3 also have another function in that they serve as stoppers to stop the flow of resin when the semiconductor chip is covered with resin as described above. During the coating of the semiconductor chip with resin, a problem arises because the leads 2 tend to be deformed, for instance, by contraction of the mold. To eliminate this problem, the narrow supports 5 provide a buffer arrangement in the lead frame to allow the leads to move with respect to the frame during contraction of the resin. Alternatively, narrow supports of Rahmen (rigid-frame) structure or bellows structure may be used. In separating the leads from the lead frame 1 after the chip is covered with resin, the lead frame is positioned by using positioning holes 9 formed in the side rails. With the lead frame thus held in position, a punch 13 is used to remove the tie bars 3 as shown in FIG. 4 and the coupling bars are similarly cut off.

As described above, when the semiconductor device is sealingly covered with resin, a contracting force acts on the leads as the resin sets, so that the leads are moved in the frame. In this operation, the narrow supports are deformed, thus absorbing the contracting force. Hence, after the semiconductor chip has been sealingly covered with resin, the leads may be shifted in position with respect to the side rails of the lead frame. In cutting the tie bars, however, the positioning holes formed in the side rails are employed as a positioning reference and, consequently, the punch cannot be accurately positioned with respect to the leads. Because of such inaccurate positioning during cutting, the resultant leads are unsatisfactory in both electrical and mechanical characteristics.

Furthermore, there has been a recent tendency for ICs or LSIs to be smaller in size and to have a larger number of functions, requiring an increase in the number of leads. As a result, the leads are even narrower, as is the spacing between the leads. In these devices, so-called "fine-pitch leads" are employed, having, for instance, a lead width of 0.1 mm, a pitch of 0.3 mm, and a lead separation of 0.2 mm. Accordingly, the fact that the leads are shifted in position during sealing as described above presents a serious problem and further impedes the manufacture of semiconductor devices having "ultra-fine-pitch" leads which are spaced at even smaller intervals.

Japanese Unexamined Published Application No. 2-17637 discloses a lead frame of the type shown in FIG. 5. That lead frame contains a positioning hole 16 in a reference part 15 which is connected by a support 14 to the die pad of the lead frame instead of to the side rail 6, and is also connected to the tie bars 3. The reference part 15 is thus supported only by the leads and the die pad which are sealingly covered with resin, and therefore it is relatively free from contraction of the resin. Accordingly, its relative position with respect to the leads can be maintained substantially unchanged during the sealing operation. On the other hand, the reference part 15 is located away from the leads, and it is supported only by the tie bars 3 and the support 14, thus being free at the opposite end. As a result, the reference part 15 is liable to be deformed by even a weak external force during manufacture. That is, it is liable to be shifted in position with respect to the leads before the device is sealingly covered with resin.

SUMMARY OF THE INVENTION

Accordingly, it is an object of the present invention to provide a lead frame and a semiconductor device using the lead frame, along with a method of manufacturing the device, which overcomes the disadvantages of the prior art.

Another object of the invention is to provide a method of manufacturing a semiconductor device in which even leads with ultra-fine spacing can be accurately cut from a lead frame and to provide a lead frame suitable for use in the method.

These and other objects of the invention are attained by providing a lead frame which includes:
(a) a die pad for mounting a semiconductor chip at the center of the frame;
(b) a plurality of leads arranged around the die pad;
(c) tie bars coupling the plurality of leads to one another;
(d) coupling bars coupling the ends of the plurality of leads to one another; and
(e) narrow supports connecting the coupling bars to surrounding members of the lead frame;
(f) in which the coupling bars having positioning holes which are used to position the frame when the tie bars are cut off.

A semiconductor device according to the invention is formed by using the lead frame described above.

The semiconductor device is manufactured according to a method which comprises the steps of:
(a) bonding a semiconductor chip onto the die pad of the above-described lead frame;

(b) electrically connecting the semiconductor chip to a plurality of leads arranged around the die pad;

(c) sealingly covering the semiconductor chip and the electrically connected portions of the plurality of leads with a resin; and (d) cutting off the tie bars while using the positioning holes which have been formed in the coupling bars which couple the end portions of the leads to one another as a positioning reference.

In the lead frame of the invention, the coupling bars coupling the end portions of the leads to one another are connected to the side rails of the frame through the narrow supports so as to release stress, and the positioning holes are formed in the coupling bars. After the semiconductor chip has been covered with sealing resin, removal of the tie bars is carried out using the positioning holes formed in the coupling bars as a positioning reference to provide closely-spaced leads. Thus, the desired semiconductor device is obtained.

Hence, even if, when the semiconductor chip is sealingly covered with resin, the resin contracts to pull the leads, the narrow supports absorb the contracting force. Therefore, although the leads and the parts covered with resin are shifted in position with respect to the side rails of the lead frame, the coupling bars having the positioning holes are not shifted in position with respect to the leads because they are coupled directly to the end portions of the leads. Hence, by providing the positioning holes in the coupling bars for a positioning reference, the tie bars can be removed and the leads cut off with high accuracy. As a result, even fine-pitch leads, which are very narrow and spaced extremely closely, can be formed with high accuracy and the leads will not be cut smaller during separation.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENT

Figure 1:
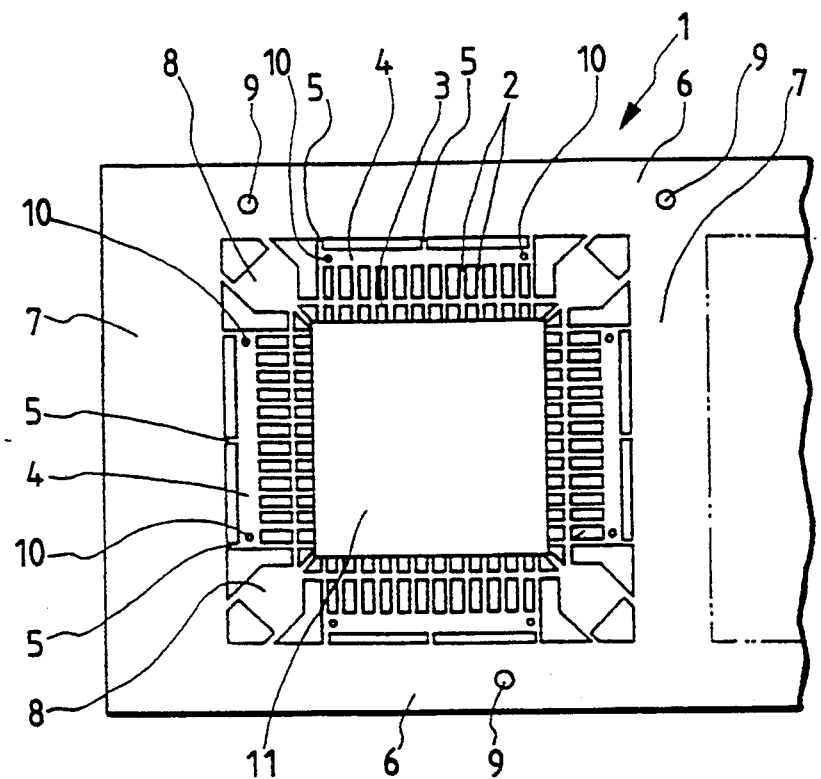
FIG. 1 is a plan view showing a representative embodiment of a lead frame according to the invention having a semiconductor chip bonded onto the lead frame and molded with resin.
Figure 2:
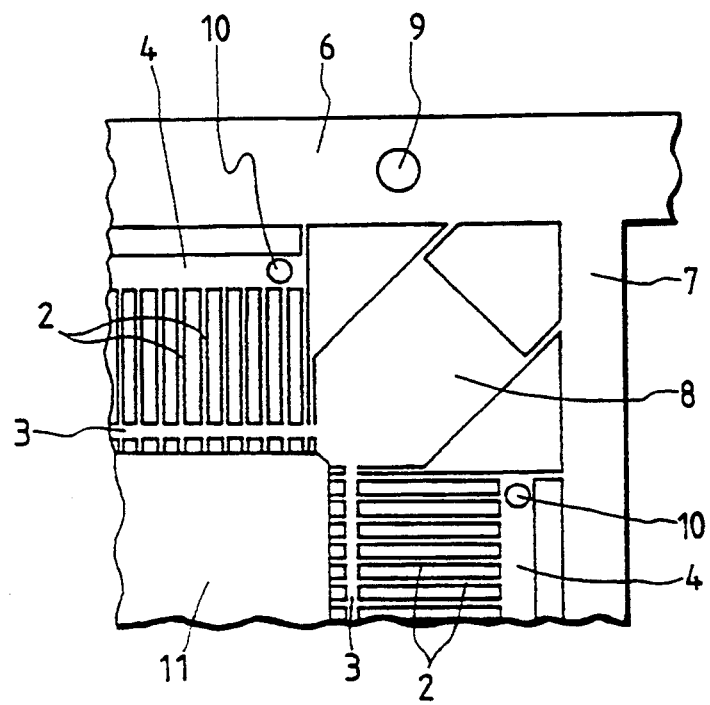
FIG. 2 is an enlarged fragmentary view illustrating the end portions of some of the leads shown in FIG. 1.
Figure 3:
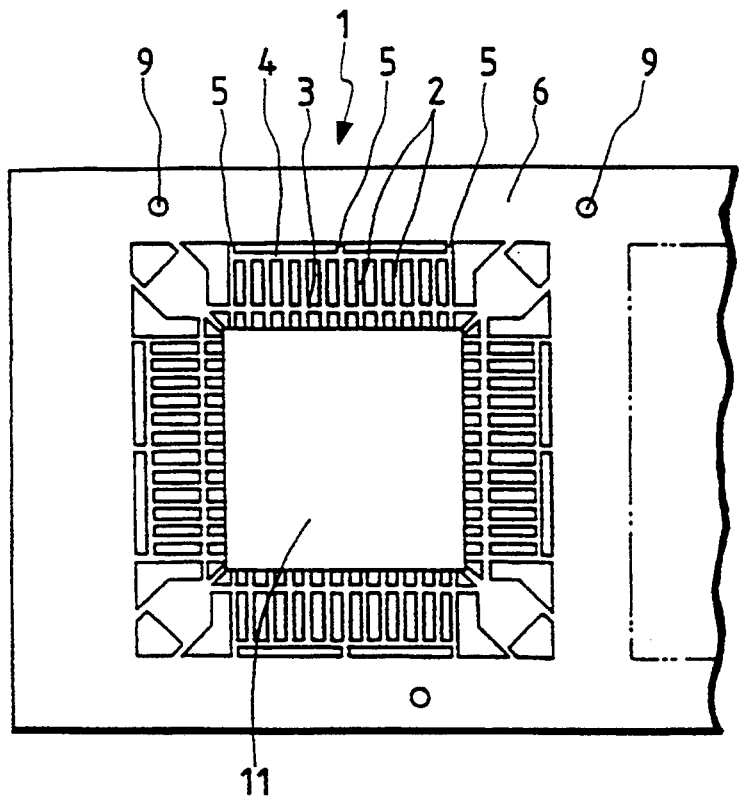
FIG. 3 is a plan view showing a conventional lead frame with a semiconductor chip molded onto the lead frame.
Figure 4:
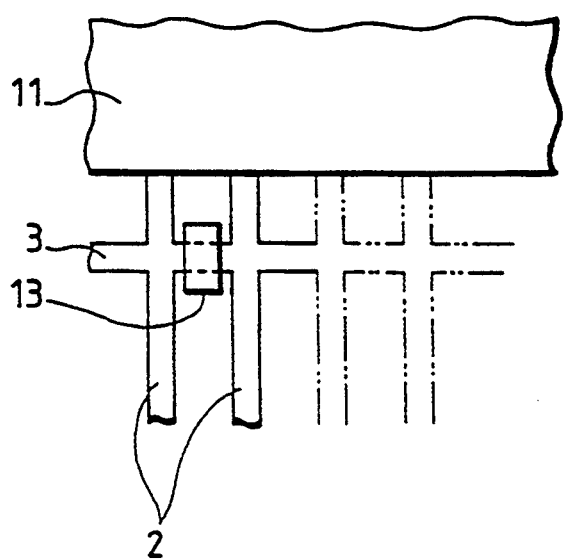
FIG. 4 is a fragmentary view illustrating a die bar cutting operation.
Figure 5:
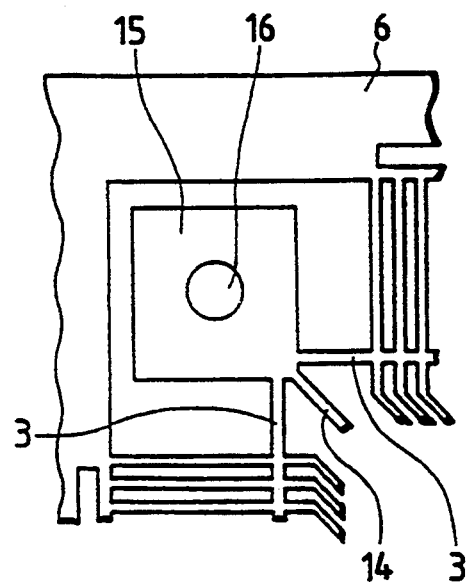
FIG. 5 is an enlarged view showing a part of another conventional lead frame.

In the typical embodiment of the invention shown in FIGS. 1 and 2, a lead frame 1 comprises an array of leads 2 which extend outwardly from a die pad (not visible) positioned at the center of the frame and which are coupled to one another with tie bars 3. The ends of the leads 2 are connected to one another with coupling bars 4, and these are held in the frame by narrow supports 5 connecting them to surrounding side rails 6 and partition members 7. The tie bars 3 hold the leads 2 at a predetermined spacing, and they also serve as stoppers to prevent the flow of resin when the semiconductor chip is covered with sealing resin 11. The die pad within the resin 11 is supported by die pad supports 8, which are also held by the side rails 6 and the partition frames 7. Index holes 9 are formed in the side rails 6. These index holes 9 are used as reference holes when the metal mold is positioned for sealingly covering the semiconductor chip with resin, or when the lead frame 1 is conveyed.

In the typical lead frame 1 arranged according to the invention, positioning holes 10 are formed in the coupling bars 4. The coupling bars 4, as described above, are formed by coupling the end portions of the leads 2 to one another, and they are thus closer to the leads 2 than the side rails 6. In addition, the coupling bars 4 are held by the narrow supports 5 to the surrounding side rails 6 and the partition members 7. Hence, even if a contracting force acts on the leads 2 to pull them when the semiconductor chip is being covered with resin 11, the leads 2 and the coupling bars 4 are scarcely shifted with respect to each other. Thus, in this arrangement, the narrow supports 5 are deformed but the predetermined positional relationships between the leads 2 and the coupling bars 4 are maintained unchanged. Consequently, when cutting the tie bars 3 from the leads 2, a punch can be positioned accurately with respect to the coupling bars 4 by using the positioning holes 10 as a positioning reference. In other words, the punch can be accurately aligned with the spaces between the leads 2. Hence, even if the leads 2 are very narrow, that is, even if the spaces between the leads 2 are very narrow, the tie bars can be suitably cut off without affecting the width of the separated leads 2.

In a typical method of manufacturing a semiconductor device using the above-described lead frame according to the invention, a semiconductor chip including a semiconductor circuit is bonded onto the die pad of the lead frame with a preforming material.

Next, wire bonding is carried out, in which the electrode pads of the semiconductor chip are electrically connected to the adjacent end portions of the leads arranged around the die pad, for instance, with gold wires.

Thereafter, the semiconductor chip together with the wire-bonded portions is transfer-molded with the resin 11 so that those parts are fixedly secured. During this step, the index holes 9 formed in the side rails 6 of the lead frame 1 are engaged with the pins of a metal transfer mold, and the resin 11 is transferred into the mold. Transfer of the resin 11 is carried out at high temperatures of 165° to 185° C. As the resin thermally sets and cools down to room temperature, a contracting force is produced which pulls on the end portions of the leads. In this case, however, the narrow supports 5 are deformed in response to the contracting force.

Thereafter, the leads 2 of the semiconductor device are cut away from the lead frame and subjected to forming. In this way, the completed semiconductor device is prepared. In cutting off the leads, the tie bars 3 coupling the leads 2 to one another are removed, and the coupling bars 4 are also removed so that the leads 2 are separated from one another. In the method of the invention, positioning the lead frame 1 on the cutter is achieved by using the positioning holes 10 formed in the coupling bars 4. That is, the lead frame 1 is positioned with reference to the coupling bars 4 coupled to the leads 2. Hence, the cutting punch can be positioned accurately with respect to the space between the leads 2, so that the tie bars 3 can be cut out with high accuracy. When the tie bars 3 are cut out, the coupling bars 4 are simultaneously removed from the ends of the leads 2, thus separating the leads from the lead frame 1. Hence, even a semiconductor device having very narrow leads with extremely narrow spaces can be manufactured without causing the leads to be shifted in position and therefore cut into and reduced in width during the cutting operation. Thus, according to the invention, semiconductor devices having fine-pitch leads can be manufactured with high reliability and a high yield. In the manufacture of the semiconductor devices, the leads are cut precisely because of the positioning of the lead frame.

According to the invention, when the leads are cut away from the lead frame, the frame is positioned by using the positioning holes formed in the coupling bars through which the end portions of the leads are connected to one another. Hence, even if the leads are shifted, for instance, by contraction of the resin when the semiconductor is sealed, the lead-cutting operation is carried out according to the positions of the shifted leads so that the leads are separated with high accuracy.

In the manufacture of a semiconductor device having fine-pitch leads, which has a tendency to increase the number of leads and accordingly to decrease the width thereof, the leads can be accurately formed by cutting the lead frame according to the invention. Furthermore, the invention eliminates the difficulties that the leads are shifted when cut, thus decreasing their widths and thereby decreasing their mechanical strength or increasing their electrical resistance. Thus, the semiconductor device manufactured according to the invention is high in reliability, small in size, and high in performance.

Although the invention has been described herein with reference to a specific embodiment, many modifications and variations therein will readily occur to those skilled in the art. Accordingly, all such variations and modifications are included within the intended scope of the invention.

I claim:

1. A method of manufacturing a semiconductor device using a lead frame having a die pad and an array of surrounding leads arranged in parallel groups of selected width along sides of the die pad, the leads in each group being connected at their sides by tie bars and at their ends by connecting bars which have positioning holes located within the width of each group of leads comprising the steps of:

(a) bonding a semiconductor chip onto the die pad of the lead frame;
    (b) electrically connecting the semiconductor chip to the leads in the array surrounding the die pad;
    (c) sealingly covering the semiconductor chip and the electrically connected portions of the surrounding leads with a resin; and
    (d) cutting out the connecting tie bars using the positioning holes located within the width of each group of leads as a positioning reference.

* * * * *